US008053954B2

(12) United States Patent
Yang et al.

(10) Patent No.: US 8,053,954 B2
(45) Date of Patent: Nov. 8, 2011

(54) PIEZOELECTRIC SPEAKER

(76) Inventors: Su-Pei Yang, Taipei (TW); Ing-Ming Lai, Taipei (TW)

( * ) Notice: Subject to any disclaimer, the term of this patent is extended or adjusted under 35 U.S.C. 154(b) by 1238 days.

(21) Appl. No.: 11/737,135

(22) Filed: Apr. 18, 2007

(65) Prior Publication Data

US 2008/0037819 A1 Feb. 14, 2008

Related U.S. Application Data

(63) Continuation-in-part of application No. 11/463,841, filed on Aug. 10, 2006, now abandoned.

(51) Int. Cl.

*H01L 41/053* (2006.01)
*H01L 41/09* (2006.01)
*H04R 7/22* (2006.01)
*H04R 1/02* (2006.01)

(52) U.S. Cl. ......... 310/354; 310/328; 310/348; 310/349

(58) Field of Classification Search .................. 310/328, 310/348, 349, 354
See application file for complete search history.

(56) References Cited

U.S. PATENT DOCUMENTS 2,203,332 A * 6/1940 Kinsley ......................... 310/331

FOREIGN PATENT DOCUMENTS

JP 07-274299 * 10/1995

* cited by examiner

*Primary Examiner* — Thomas Dougherty
(74) *Attorney, Agent, or Firm* — Pai Patent & Trademark Law Firm; Chao-Chang David Pai

(57) ABSTRACT

A piezoelectric speaker includes a cabinet, piezoelectric vibrators horizontally mounted inside the cabinet at different elevations each having two eyed lugs respectively coupled to respective posts in the cabinet, a shock absorber coupled to the piezoelectric material of the piezoelectric vibrators, two conducting terminals accommodated inside the cabinet and clamped on the piezoelectric vibrators, and two clamps fastened to the conducting terminals to secure a respective signal line.

14 Claims, 12 Drawing Sheets

PIEZOELECTRIC SPEAKER

CROSS-REFERENCE TO RELATED APPLICATIONS

This application is a continuation-in-part application of prior U.S. application Ser. No. 11/463,841, filed Aug. 10, 2006, which is pending.

BACKGROUND OF THE INVENTION (a) Field of the Invention

The present invention relates to speakers and, more particularly, to a thin-type piezoelectric speaker.

(b) Description of the Prior Art

Piezoelectricity is the ability of crystals to generate a voltage in response to applied mechanical stress. Piezoelectric materials such as piezoelectric crystals, Rochelle salt, ceramics of barium titanate series, etc., are widely used. Longitudinal vibrator type, dual-state type, piezoelectric polymer type, and many other types of piezoelectric speakers are known to have thin and small-sized characteristics. A longitudinal vibrator type or piezoelectric polymer type speaker has a defined end connected to another body so that sound can be produced when electrically connected. Therefore, a longitudinal vibrator or piezoelectric polymer may have a fixation device at one end thereof for mounting, for example, for fastening to a cell phone, multimedia player, notebook computer, etc.

Because a longitudinal vibrator or piezoelectric polymer for speaker has a small size, it is difficult to provide a suitable fixation device at its one end for mounting. Even if a longitudinal vibrator or piezoelectric polymer is provided with a fixation device, it is still difficult to fix the fixation device to another object. After fixation of the fixation device to another object, the fixation device may be disconnected from the object easily by accident. Further, a longitudinal vibrator has electric wires or signal lines soldered thereto. These electric wires or signal lines complicate the installation procedure of the piezoelectric speaker in, for example, a cell phone, multimedia player or notebook computer. Further, the soldering quality may have a great impact on the quality of output sound.

Therefore, it is desirable to provide a piezoelectric speaker that eliminates the aforesaid drawbacks.

SUMMARY OF THE INVENTION

The present invention has been accomplished under the circumstances in view. It is one object of the present invention to provide a piezoelectric speaker, which is easy to install. It is another object of the present invention to provide a piezoelectric speaker, which provides a high output sound quality. It is still another object of the present invention to provide a piezoelectric speaker, which prevents an excessive high frequency during operation.

To achieve these and other objects of the present invention, the piezoelectric speaker comprises a cabinet, the cabinet comprising a box body and a box cover covering the box body, the box body having two locating rods in an inside space thereof near one end and two accommodation grooves adjacent to the locating rods; at least one piezoelectric vibrator respectively covered with a piezoelectric material and mounted inside the box body of the cabinet, the at least one piezoelectric vibrator each having two lugs protruded from one side thereof, the lugs each having a mounting through hole respectively coupled to the locating rods of the box body; a shock absorber, the shock absorber having a plate-like body coupled to the piezoelectric material of the at least one piezoelectric vibrator; a first conducting terminal and a second conducting terminal adapted to connect a respective signal line to the at least one piezoelectric vibrator, the first conducting terminal and the second conducting terminal each having a contact portion disposed in contact with the piezoelectric material of the at least one piezoelectric vibrator and a mounting portion respectively accommodated in the accommodation grooves of the box body for the connection of a respective signal line; and two clamps made of a respective metal spring plate and respectively mounted in the accommodation grooves of the box body and clamped on the mounting portions of the first conducting terminal and the second conducting terminal to hold a respective signal line in connection.

DETAILED DESCRIPTION OF THE PREFERRED EMBODIMENTS

Figure 1:
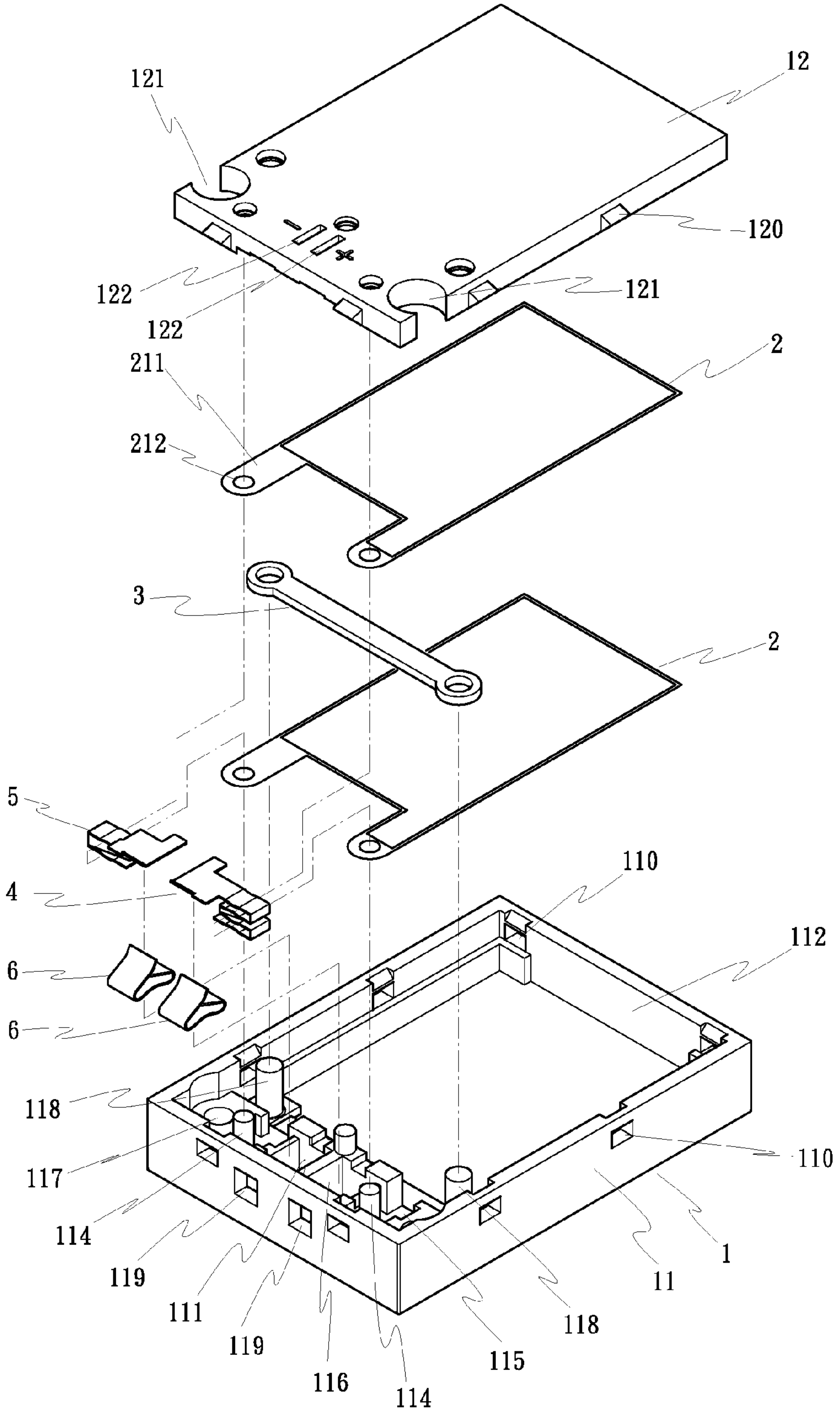
FIG. 1 is an exploded view of a piezoelectric speaker according to the present invention.
Figure 2:
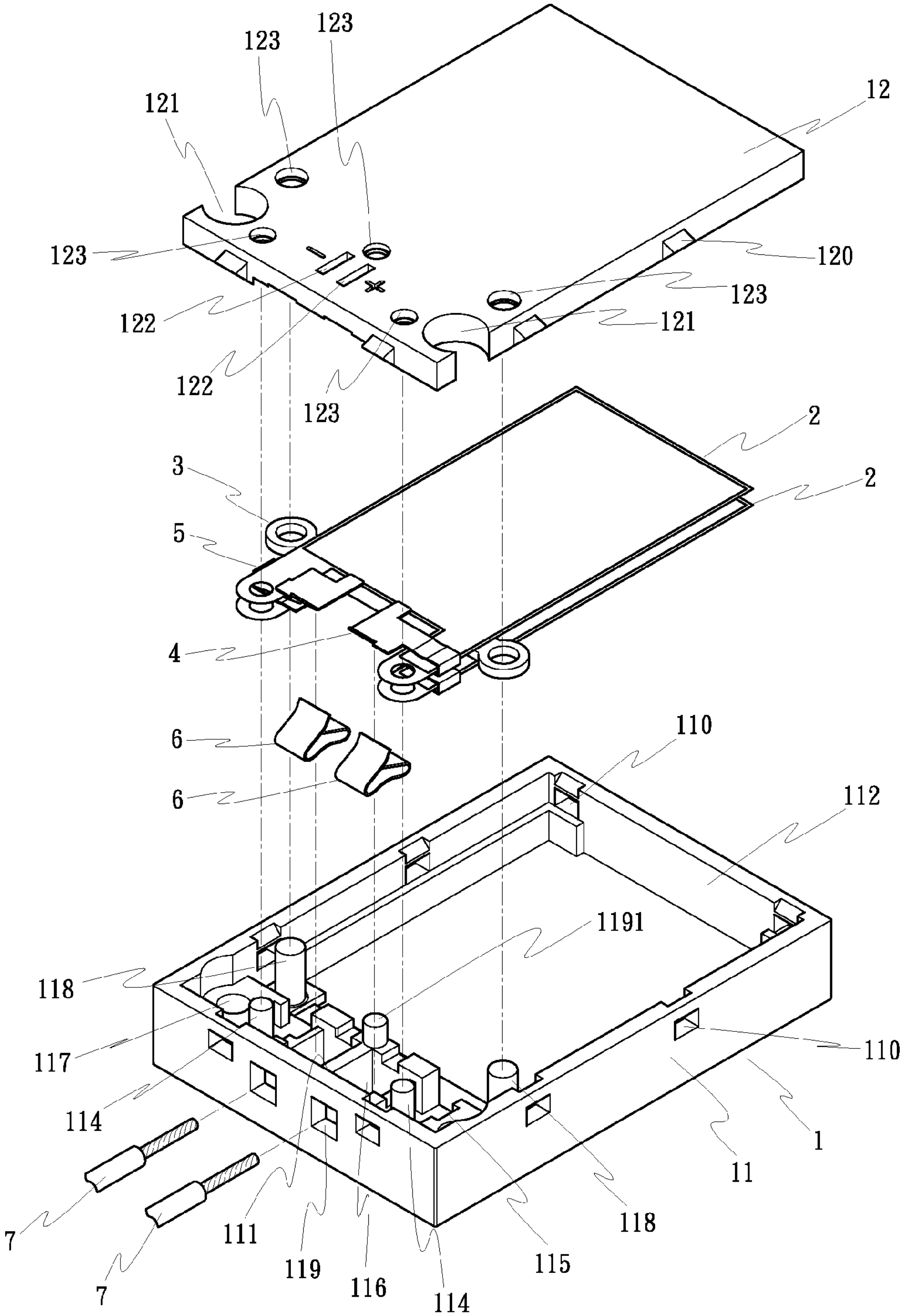
FIG. 2 is another exploded view of the piezoelectric speaker shown in FIG. 1 after assembly of some of the component parts.
Figure 3:
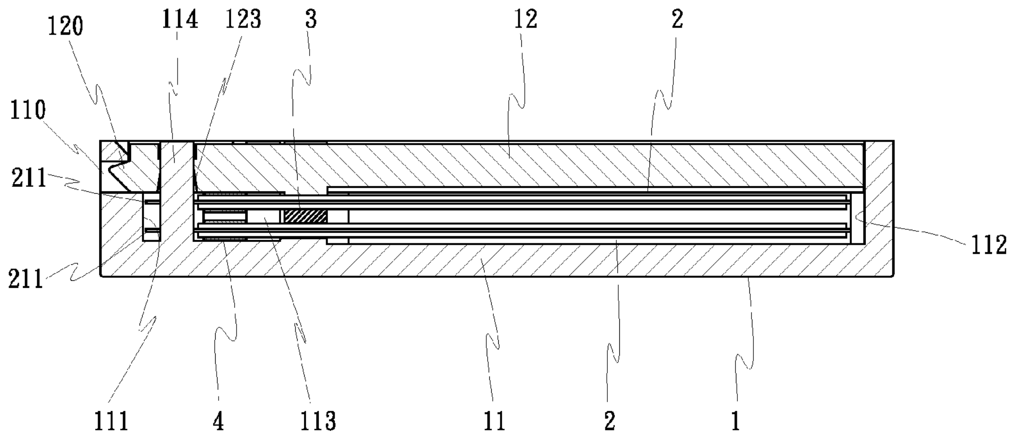
FIG. 3 is a longitudinal sectional view of the piezoelectric speaker according to the present invention.
Figure 4:
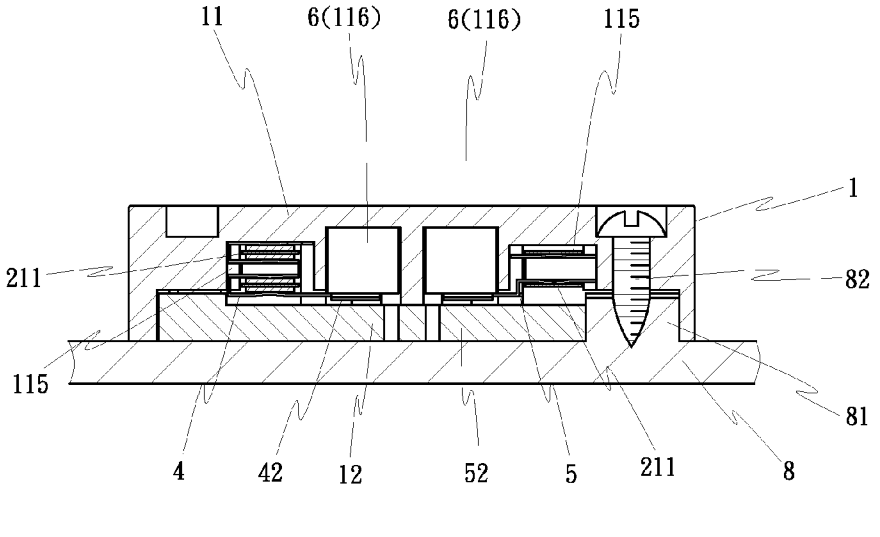
FIG. 4 is a cross sectional view of the piezoelectric speaker according to the present invention.
Figure 5:
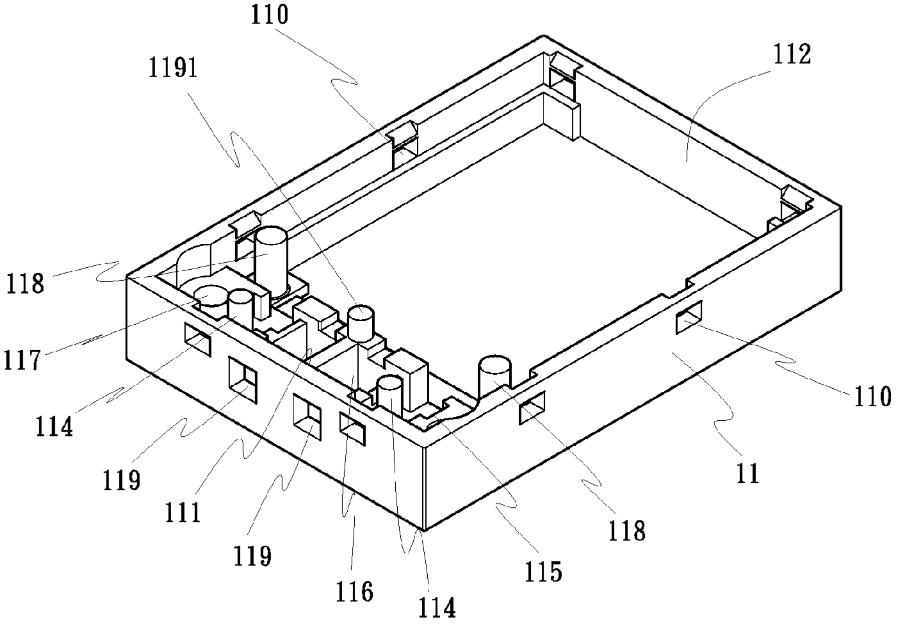
FIG. 5 is a perspective view of the box body of the cabinet of the piezoelectric speaker according to the present invention.
Figure 6:
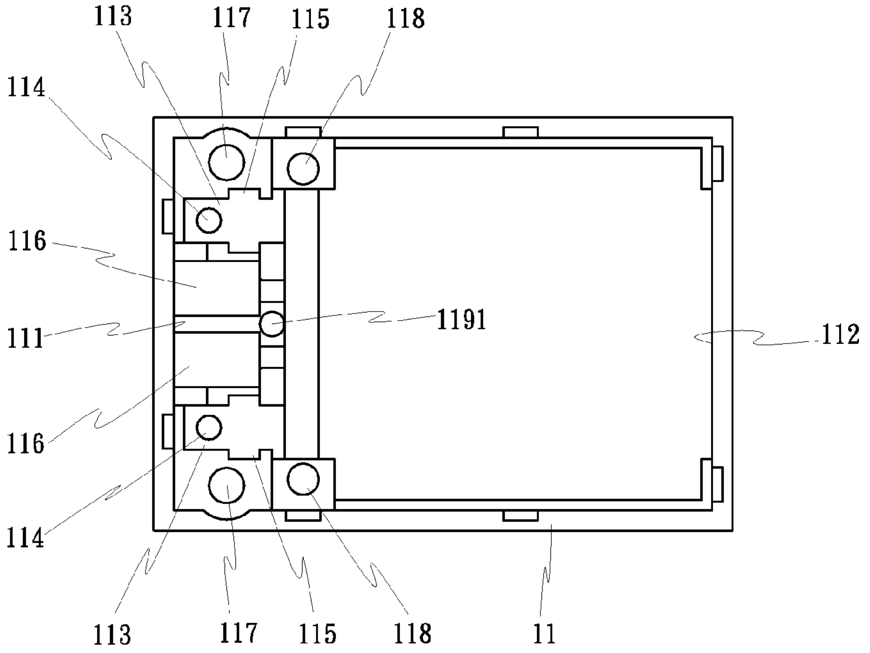
FIG. 6 is a top view of the box body of the cabinet of the piezoelectric speaker according to the present invention.

Referring to FIGS. 1~6, a piezoelectric speaker in accordance with the present invention comprises a cabinet 1, two piezoelectric vibrators 2, a shock absorber 3, two conducting terminals 4 and 5, and two clamps 6.

Figure 7:
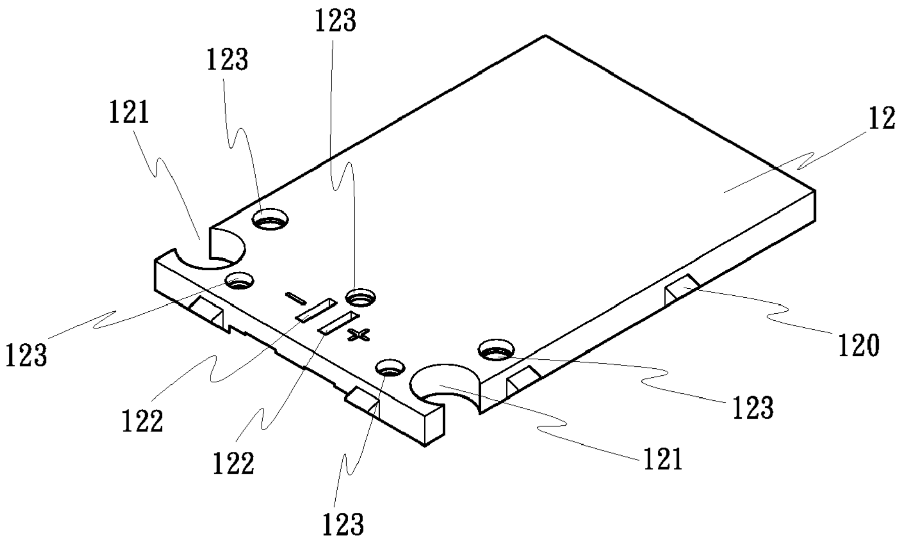
FIG. 7 is a perspective view of the box cover of the cabinet of the piezoelectric speaker according to the present invention.

The cabinet 1 (see FIGS. 1 and 3) is a hollow enclosed box formed of a box body 11 and a box cover 12. The box body 11 is a rectangular container (see FIGS. 5 and 6) defining a fixed end 111 and a free end 112. The box body 11 has two parallel wells 113 inside the fixed end 111, two locating members, for example, locating rods 114 respectively provided inside the wells 113 for securing the piezoelectric vibrators 2, two mounting portions, for example, mounting notches 115 respectively and transversely disposed in the wells 113 at one side for securing the conducting terminals 4 and 5, two accommodation grooves 116 respectively disposed adjacent to the locating rods 114 for accommodating the clamps 6, two vertical screw holes 117 respectively disposed in the wells 113 near the two opposite lateral sides of the box body 11, two posts 118 respectively and symmetrically disposed near the vertical screw holes 117 and relatively closer to the free end 112 than the vertical screw holes 117, and two through holes 19 horizontally extending through the fixed end 111 corresponding to the accommodation grooves 116 for the passing of signal lines 7. The box cover 12 is a flat rectangular cover plate (see FIG. 7) for closing the box body 11, having two mounting holes 121 respectively fastened to the vertical screw holes 117 of the box body 11 with screws 82 (see FIG. 4). Further, the accommodation grooves 116 are deep grooves in the wells 113, and the mounting notches 115 are shallow grooves in the wells 113.

Figure 8:
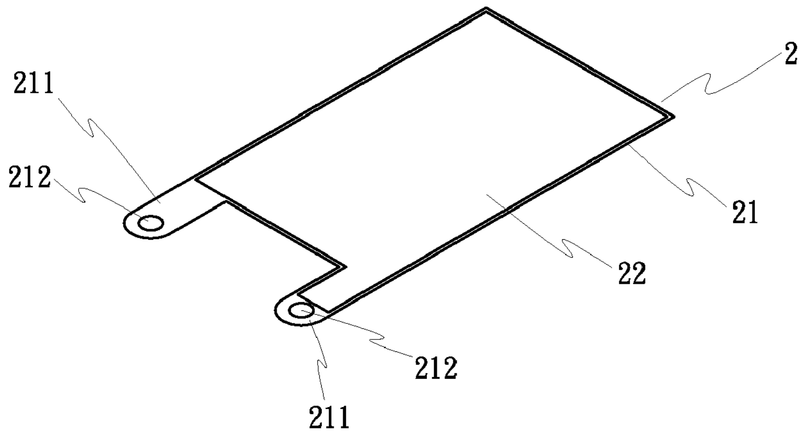
FIG. 8 is a perspective view of one piezoelectric vibrator according to the present invention.
Figure 14:
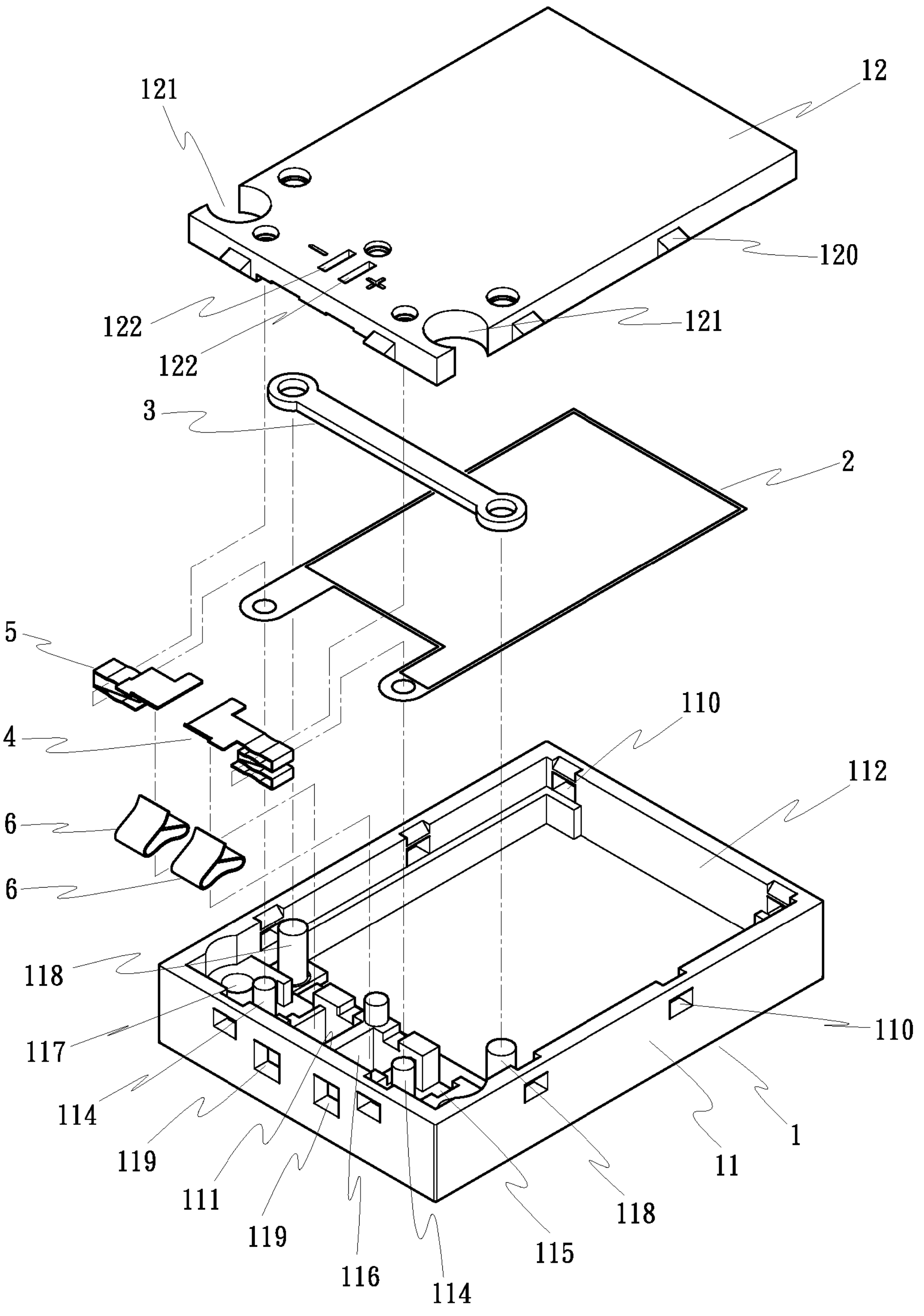
FIG. 14 is an exploded view of an alternate form of the piezoelectric speaker according to the present invention.
Figure 15:
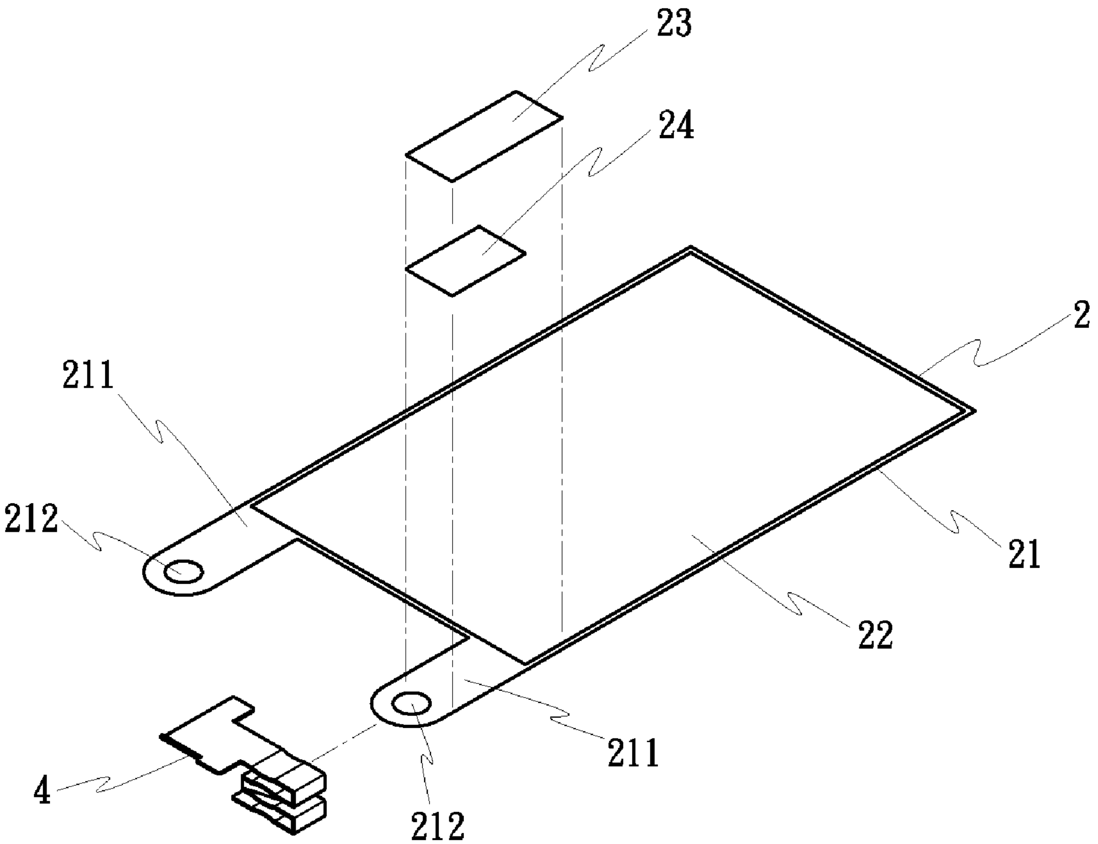
FIG. 15 shows an alternate form of the piezoelectric vibrator according to the present invention.
Figure 16:
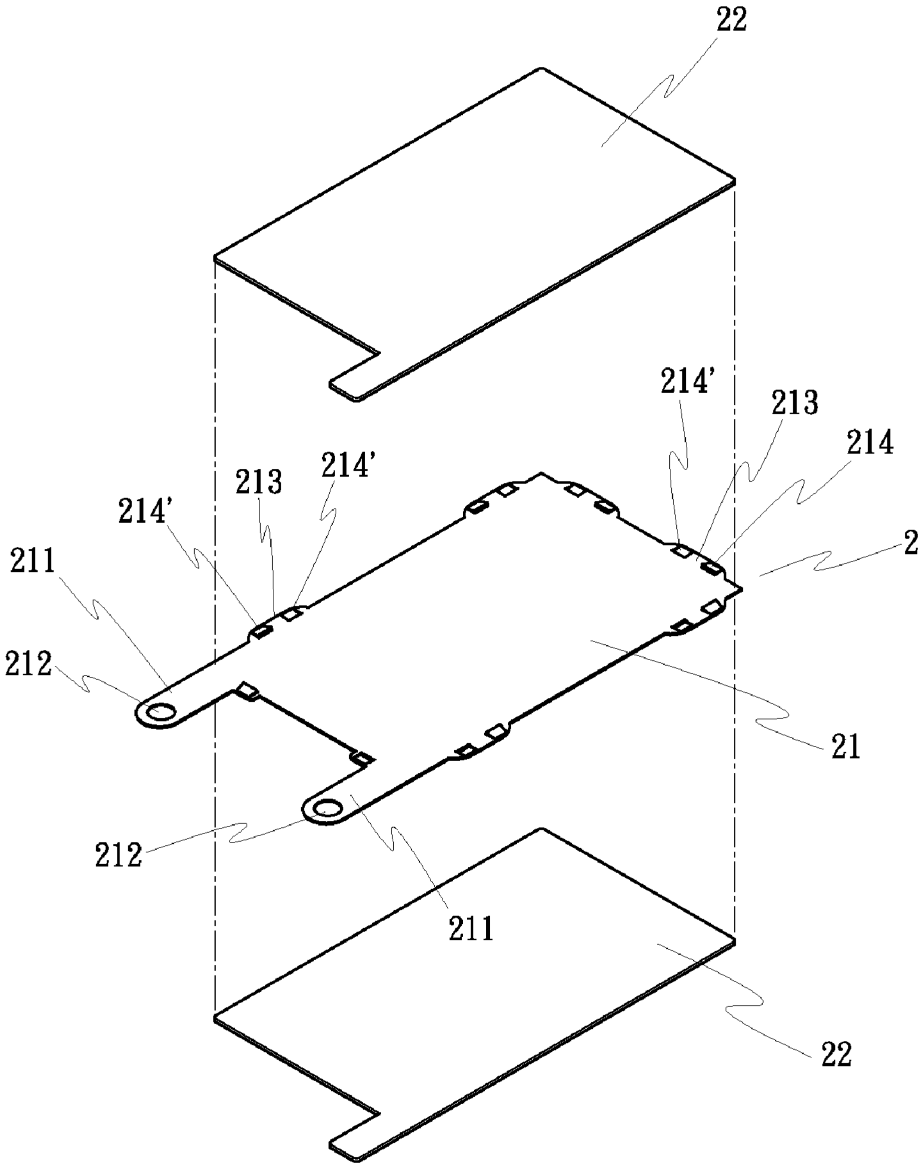
FIG. 16 is an exploded view of another alternate form of the piezoelectric vibrator according to the present invention.

The piezoelectric vibrators 2 (see FIGS. 1 and 8) can vibrate and produce sound when electrically connected. Each piezoelectric vibrator 2 comprises a flat base sheet member 21, and a layer of piezoelectric material (for example, barium titanate ceramics) 22 covered on both the top and bottom sides of the flat base sheet member 21. The flat base sheet member 21 has two forwardly protruding lugs 211. Each lug 211 has a mounting through hole 212. The piezoelectric material 22 extends to the mounting through hole 212 of one of the lugs 211. The other lug 211 is kept blank without the piezoelectric material 22. The two piezoelectric vibrators 2 are arranged inside the box body 11 of the cabinet 1 at different elevations (see FIGS. 1 and 2). After installation of the piezoelectric vibrators 2 in the box body 11 of the cabinet 1, the two lugs 211 are respectively positioned in the wells 113, and the mounting through holes 212 of the lugs 211 are respectively fastened to the locating rods 114 (see FIGS. 3 and 4). Thus, the piezoelectric vibrators 2 each have a fixed end and a free end. In an alternate form of the present invention as shown in FIG. 14, only one piezoelectric vibrator 2 is used. Further, a piezoelectric speaker in accordance with the present invention can use more than two piezoelectric vibrators. Further, a copper strip 23 may be bonded to one lug 211 by means of an electrically insulative adhesive member, for example, a double-sided adhesive tape 24 (see FIG. 15), keeping one end of the copper strip 23 pressed on the surface of the piezoelectric material 22 for the connection of the associated conducting terminal 4. Further, as shown in FIG. 16, the flat base sheet member 21 has a plurality of protruding portions 213 projecting from the periphery at selected locations, and two protruding blocks 214 and 214' respectively protruded from the top and bottom sides of each protruding portion 213 to support the associating layers of piezoelectric material 22.

Figure 9:
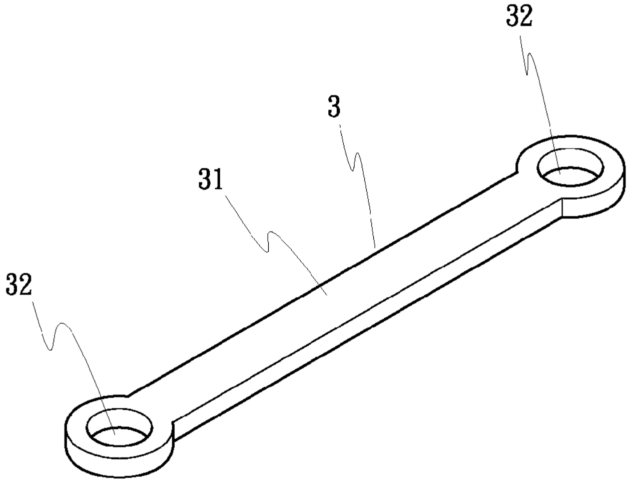
FIG. 9 is a perspective view of the shock absorber according to the present invention.

The shock absorber 3 can be made of silicone rubber, rubber, polyurethane, or any of a variety of other suitable shock absorbing materials. The shock absorber 3 is mounted inside the cabinet 1 and fastened to the piezoelectric material 22 of each piezoelectric vibrator 2 near its fixed end. In one embodiment of the present invention as shown in FIG. 9, the shock absorber 3 comprises an elongated body 31 and two eyelets 32 at the ends of the elongated body 31. The elongated body 31 is attached to the piezoelectric material 22 of each piezoelectric vibrator 2 with the two eyelets 32 respectively coupled to the posts 118 in the box body 11 for lowering the frequency of the piezoelectric vibrators 2.

Figure 10:
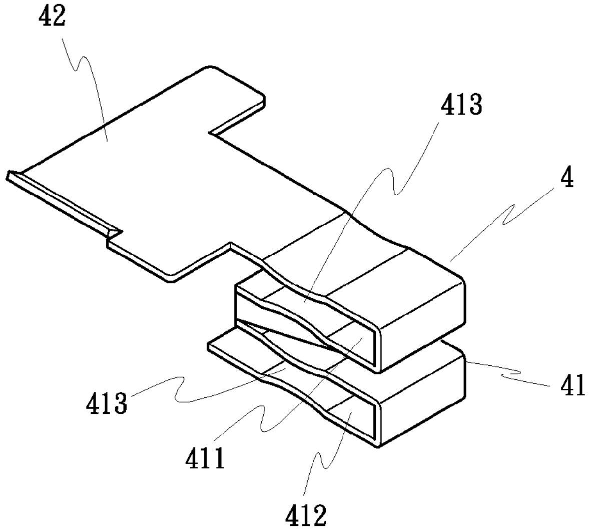
FIG. 10 is a perspective view of the first conducting terminal according to the present invention.
Figure 11:
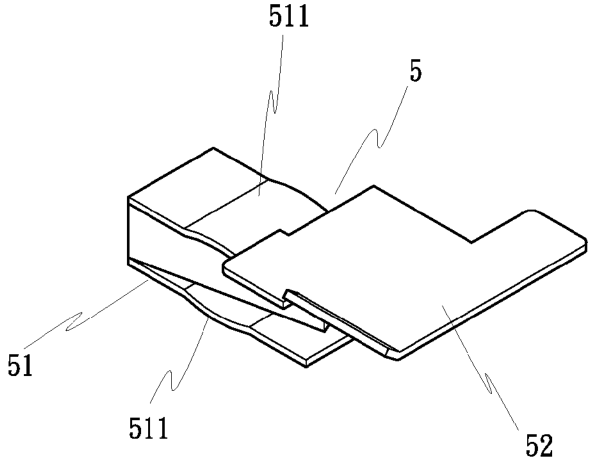
FIG. 11 is a perspective view of the second conducting terminal according to the present invention.
Figure 12:
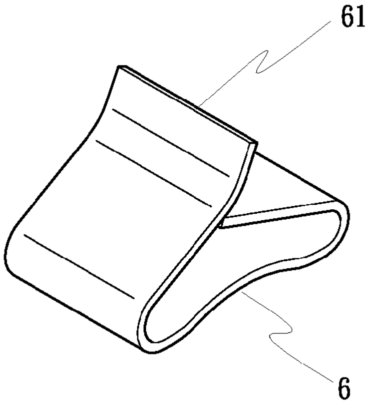
FIG. 12 is a perspective view of a clamp according to the present invention.

The two conducting terminals 4 and 5 are directly stamped from a metal plate. One conducting terminal, namely, the first conducting terminal 4 has a contact portion 41 and a mounting portion 42 (see FIG. 10). The contact portion 41 is curved, defining an upper insertion hole 411 and a lower insertion hole 412 for receiving the piezoelectric vibrators 2. The first conducting terminal 4 further has raised portions 413 in the insertion holes 411 and 412. The mounting portion 42 is a flat member connected to one end of the contact portion 41. The other conducting terminal, namely, the second conducting terminal 5 has a contact portion 51 and a mounting portion 52 (see FIG. 11). The contact portion 51 is a substantially U-shaped member having raised portions 511 on the inside. The mounting portion 52 is a flat member connected to one end of the contact portion 51. The two conducting terminals 4 and 5 are respectively fastened to the mounting notches 115 in the box body 11 (see FIGS. 1~4), keeping the raised portions 413 and 511 in positive contact with the lugs 211 of the piezoelectric vibrators 2 and the mounting portions 42 and 52 extending into the accommodation grooves 116.

Bending a respective metal spring plate into a substantially triangular structure respectively makes the two clamps 6. Each clamp has a clamping end 61. The two clamps 6 are respectively mounted in the accommodation grooves 116 inside the cabinet 1 with the respective clamping ends 61 respectively clamped on the mounting portions 42 and 52 to connect the signal lines 7 to the conducting terminals 4 and 5 respectively.

The desired piezoelectric speaker is thus obtained when the cabinet 1, the piezoelectric vibrators 2, the shock absorber 3, the conducting terminals 4 and 5 and the clamps 6 are assembled.

As indicated above, the mounting through holes 212 of the lugs 211 of the piezoelectric vibrators 2 are respectively coupled to the locating rods 114 in the box body 11 of the cabinet 1. After closing of the box cover 12 on the box body 11, the box cover 12 holds down the piezoelectric vibrators 2 in place. Further, the two conducting terminals 4 and 5 are respectively and directly connected to the two piezoelectric vibrators 2 without soldering. Further, the shock absorber 3 has its two eyelets 32 respectively coupled to the posts 118 inside the cabinet 1 with the elongated body 31 coupled to the piezoelectric material 22 of the piezoelectric vibrators 2 to absorb shocks, preventing an excessive high frequency during the operation of the piezoelectric speaker. Further, screws 82 are mounted in the mounting holes 121 of the box cover 12 and the vertical screw holes 117 of the box body 11 for fastening the cabinet 1 to a substrate 8 (see FIG. 4) in, for example, a cell phone, multimedia player, or notebook computer. The use of the screws 82 to fasten the cabinet 1 to the substrate 8 instead of a bonding material as used in conventional designs simplifies the installation and assures high stability. The substrate 8 has protruded locating blocks 81 for the mounting of the screws 82 (see FIG. 4), preventing damage to the substrate 8 due to direct threading of the screws 82 into the substrate 8.

Figure 13:
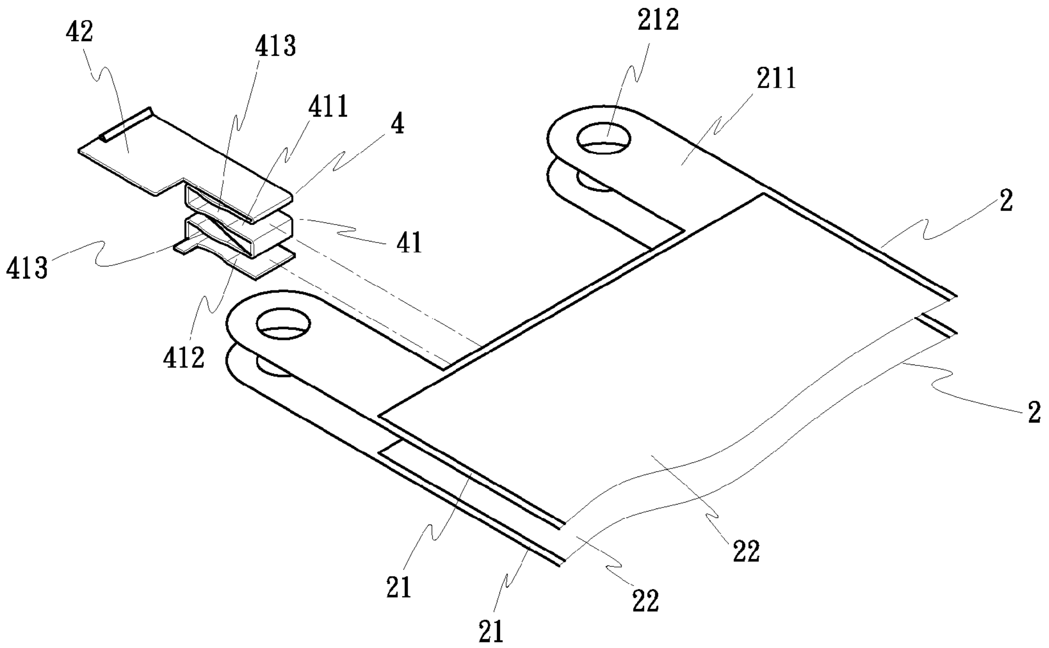
FIG. 13 is an exploded view, illustrating a mounting example of an alternate form of the first conducting terminal on the piezoelectric vibrators according to the present invention.

FIG. 13 shows an alternate form of the first conducting terminal 4. According to this embodiment, the upper insertion hole 411 and lower insertion hole 412 of contact portion 41 extend outwards, thereby forming two clamping mouths that can be directly clamped on the piezoelectric vibrators 2 at any desired location beyond the lugs 211.

Figure 17:
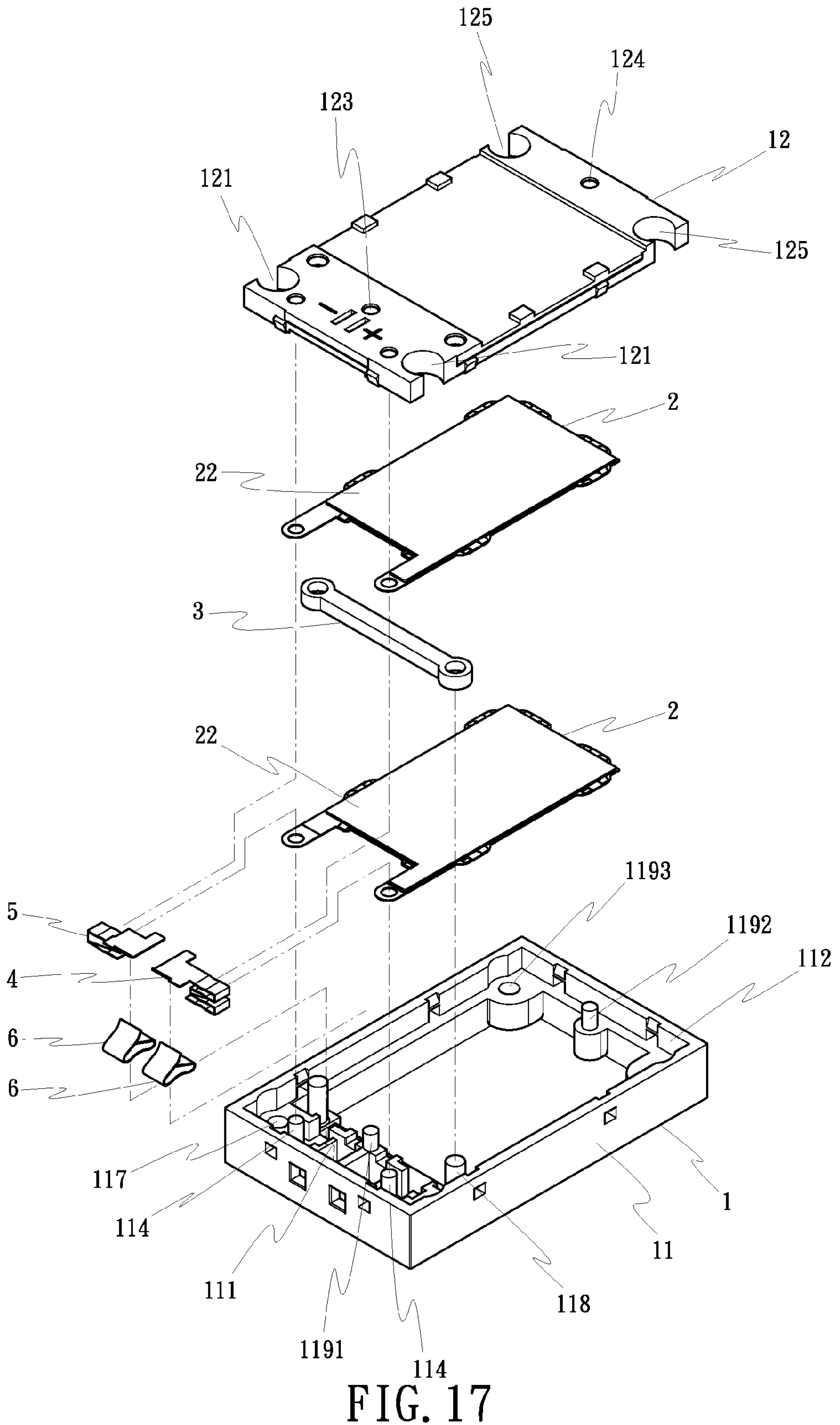
FIG. 17 is an exploded view of the present invention, showing an alternate form of the cabinet.

Referring to FIGS. 1 and 2 again, the box body 11 of the cabinet 1 has a plurality of mounting holes 110 on the two opposite lateral sides thereof, and the box cover 12 has a plurality of locating blocks 120 respectively protruded from the two opposite lateral sides thereof and respectively engaged into the mounting holes 110 of the box body 11. The box body 11 further has a mounting rod 1191. The box cover 12 further has a plurality of tapered locating holes 123 respectively fastened to the mounting rod 1191, posts 118 and locating rods 114 of the box body 11 (see FIGS. 2 and 3) to prevent vibration of the box cover 12 relative to the box body 11. FIG. 17 shows an alternate form of the cabinet 1. According to this alternate form, the box body 11 has a mounting rod 1192 upwardly extending from the free end 112 on the middle, and two screw holes 1193 respectively disposed at two sides of the free end 112; the box cover 12 has a tapered locating hole 124 corresponding to the mounting rod 1192, and two mounting holes 125 corresponding to the screw holes 1193 of the box body 11. During installation, the box cover 12 is covered on the box body 11 to force the tapered locating holes 123 and 124 into engagement with the associating mounting rods 1191 and 1192, and then the mounting holes 121 and 125 of the box cover 12 are respectively fastened to the screw holes 117 and 1193 of the box body 11. Because the piezoelectric vibrators 2 are mounted inside the cabinet 1, the output sound quality of the piezoelectric speaker after connection of electricity to the piezoelectric vibrators 2 is much better than conventional designs. After fixation of the cabinet 1 to the substrate 8 or any other object, an optimum sound effect can be provided.

Referring to FIG. 2 again, the box cover 12 has two slots 122 corresponding to the accommodation grooves 116 of the box body 11. Before installation of the signal lines 7, a screwdriver or like tool is inserted into each slot 122 to press down the clamping end 61 of the respective clamp 6. After insertion of each signal line 7 into the cabinet 1, the screwdriver is removed from the slot 122 to release the respective clamp 6, enabling the clamping end 61 to clamp the respective signal line 7.

A prototype of piezoelectric speaker has been constructed with the features of FIGS. 1~14. The piezoelectric speaker functions smoothly to provide all of the features disclosed earlier.

Although particular embodiment of the invention have been described in detail for purposes of illustration, various modifications and enhancements may be made without departing from the spirit and scope of the invention. Accordingly, the invention is not to be limited except as by the appended claims.

What is claimed is:

1. A piezoelectric speaker comprising:

a cabinet, said cabinet comprising a box body and a box cover covering said box body, said box body having two locating rods in an inside space thereof near one end and two accommodation grooves adjacent to said locating rods;

at least one piezoelectric vibrator respectively covered with a piezoelectric material and mounted inside said box body of said cabinet, said at least one piezoelectric vibrator each having two lugs protruded from one side thereof, said lugs each having a mounting through hole respectively coupled to the locating rods of said box body;

a shock absorber, said shock absorber having a plate-like body coupled to the piezoelectric material of said at least one piezoelectric vibrator;

a first conducting terminal and a second conducting terminal adapted to connect a respective signal line to said at least one piezoelectric vibrators, said first conducting terminal and said second conducting terminal each having a contact portion disposed in contact with the piezoelectric material of said at least one piezoelectric vibrator and a mounting portion respectively accommodated in said accommodation grooves of said box body for the connection of a respective signal line; and two clamps made of a respective metal spring plate and respectively mounted in said accommodation grooves of said box body and clamped on the mounting portions of said first conducting terminal and said second conducting terminal to hold a respective signal line in connection.

2. The piezoelectric speaker as claimed in claim 1, wherein said at least one piezoelectric vibrator includes a plurality of piezoelectric vibrators arranged at different elevations inside said box body of said cabinet and respectively coupled to two opposite sides of said shock absorber.

3. The piezoelectric speaker as claimed in claim 1, wherein said box body has two mounting notches respectively disposed adjacent to said locating rods for securing said first conducting terminal and said second conducting terminal, and two through holes extending to the outside thereof corresponding to said accommodation grooves for receiving a respective signal line for connection to said first conducting terminal and said second conducting terminal.

4. The piezoelectric speaker as claimed in claim 3, wherein said box body has two parallel wells in which said locating rods and said mounting notches are disposed, said mounting notches being transverse grooves in said wells; said accommodation grooves are formed in said wells in a relatively deeper manner relative to said transverse notches.

5. The piezoelectric speaker as claimed in claim 1, wherein said box body has two vertically extending screw holes respectively disposed adjacent to said locating rods; said box cover has two mounting holes corresponding to he vertically extending screw holes of said box body, and two mounting screws respectively mounted in the mounting holes and fastened to the vertically extending screw holes of said box body and extending out of said box body for securing said box body to an external object.

6. The piezoelectric speaker as claimed in claim 1, wherein said box body comprises two symmetrical posts; said shock absorber comprises two eyelets respectively extended from two distal ends of the body thereof and respectively coupled to said symmetrical posts.

7. The piezoelectric speaker as claimed in claim 1, wherein the contact portion of said first conducting terminal has a plurality of vertically spaced insertion holes for receiving said at last one piezoelectric vibrator, and a plurality of raised portions disposed in said vertically spaced insertion holes for pressing said at lest one piezoelectric vibrators; the contact portion of said second conducting terminal has a U-shaped profile and a plurality of raised portions for pressing on said at least one piezoelectric vibrators on two sides.

8. The piezoelectric speaker as claimed in claim 7, wherein the two lugs of each of said at least one piezoelectric vibrator include a first lug covered with said piezoelectric material and a second lug without said piezoelectric material.

9. The piezoelectric speaker as claimed in claim 7, wherein the vertically spaced insertion holes of the contact portion of said first conducting terminal extend outwards such that the contact portion of said first conducting terminal is connectable to a part of each of said at least one piezoelectric vibrator beyond the lugs of the respective piezoelectric vibrator.

10. The piezoelectric speaker as claimed in claim 1, wherein said box body has a plurality of mounting holes on two opposite lateral sides thereof; said box cover has a plurality of locating blocks respectively protruded from two opposite lateral sides thereof and respectively engaged into the mounting holes of said box body.

11. The piezoelectric speaker as claimed in claim 3, wherein said box cover has two tool slots corresponding to the accommodation grooves of said box body.

12. The piezoelectric speaker as claimed in claim 1, wherein the lugs of each of said at least one piezoelectric vibrator has a copper strip bonded thereto with an electrically insulative adhesive member, said copper strip having one end pressed on the surface of the piezoelectric material of the respective piezoelectric vibrator for the connection of the associated conducting terminal.

13. The piezoelectric speaker as claimed in claim 1, wherein said at least one piezoelectric vibrator each comprises a flat base sheet member, said flat base sheet member having a plurality of protruding portions projecting from the periphery thereof at selected locations and two protruding blocks respectively protruded from top and bottom sides of each of said protruding portions to support a respective layer of said piezoelectric material.

14. The piezoelectric speaker as claimed in claim 1, wherein said box body has a locating rod upwardly extending from a free end thereof and two screw holes disposed in said free end at two sides; said box cover has a tapered locating hole coupled to the locating rod at the free end of said box body, and two screw holes respectively connected to the screw holes at the free end of said box body.

* * * * *